(12) United States Patent
Zimmer et al.

(10) Patent No.: US 9,691,970 B2
(45) Date of Patent: Jun. 27, 2017

(54) MAGNETORESISTIVE DEVICES AND METHODS FOR MANUFACTURING MAGNETORESISTIVE DEVICES

(71) Applicant: Infineon Technologies AG, Neubiberg (DE)

(72) Inventors: Juergen Zimmer, Neubiberg (DE); Wolfgang Raberg, Sauerlach (DE); Stephan Schmitt, Munich (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/966,205

(22) Filed: Dec. 11, 2015

(65) Prior Publication Data

US 2016/0099405 A1    Apr. 7, 2016

Related U.S. Application Data

(62) Division of application No. 13/850,345, filed on Mar. 26, 2013, now Pat. No. 9,240,546.

(51) Int. Cl.
| | |
|---|---|
| *H01L 29/82* | (2006.01) |
| *H01L 43/08* | (2006.01) |
| *H01L 43/12* | (2006.01) |
| *H01L 43/02* | (2006.01) |

(52) U.S. Cl.
CPC .............. *H01L 43/08* (2013.01); *H01L 43/02* (2013.01); *H01L 43/12* (2013.01)

(58) Field of Classification Search
CPC .......... H01L 43/08; H01L 43/02; H01L 43/12
See application file for complete search history.

(56) References Cited

U.S. PATENT DOCUMENTS

| 7,088,612 B2 | 8/2006 | Braun et al. |
| 7,092,284 B2 | 8/2006 | Braun |
| 7,495,434 B2 | 2/2009 | Zimmer et al. |
| 7,872,564 B2 | 1/2011 | Zimmer |
| 7,919,794 B2 * | 4/2011 | Gu ........................ G11C 11/16 257/241 |
| 8,193,897 B2 | 6/2012 | Zimmer |
| 8,884,616 B2 | 11/2014 | Zimmer et al. |
| 8,891,207 B1 | 11/2014 | Li et al. |
| 8,896,040 B2 | 11/2014 | Lee |
| 9,224,939 B2 | 12/2015 | Lee et al. |
| 2005/0052903 A1 | 3/2005 | Hayashi |
| 2005/0105219 A1 | 5/2005 | Mao et al. |
| 2005/0128802 A1 | 6/2005 | Motoyoshi |
| 2006/0114620 A1 | 6/2006 | Sbiaa et al. |

(Continued)

OTHER PUBLICATIONS

Non-Final Office Action dated Jul. 9, 2014 for U.S. Appl. No. 13/850,345.

(Continued)

*Primary Examiner* — Yosef Gebreyesus

(74) *Attorney, Agent, or Firm* — Eschweiler & Potashnik, LLC

(57) ABSTRACT

A magnetoresistive device includes a substrate and an electrically insulating layer arranged over the substrate. The magnetoresistive device further includes a first free layer embedded in the electrically insulating layer and a second free layer embedded in the electrically insulating layer. The first free layer and the second free layer are separated by a portion of the electrically insulating layer.

12 Claims, 9 Drawing Sheets

(56) References Cited

U.S. PATENT DOCUMENTS

| | | |
|---|---|---|
| 2006/0233017 A1 | 10/2006 | Hosotani et al. |
| 2007/0002503 A1 | 1/2007 | Sbiaa et al. |
| 2007/0097560 A1 | 5/2007 | Karr et al. |
| 2008/0032159 A1 | 2/2008 | Gill |
| 2009/0189601 A1 | 7/2009 | Okada |
| 2010/0003767 A1* | 1/2010 | Cho ................ H01L 43/08 438/3 |
| 2010/0053823 A1 | 3/2010 | Iwayama |
| 2010/0188893 A1 | 7/2010 | Zhou |
| 2010/0193888 A1* | 8/2010 | Gu ................... H01L 43/08 257/421 |
| 2011/0037459 A1 | 2/2011 | Okada |
| 2011/0241138 A1* | 10/2011 | Hsieh ............... B82Y 25/00 257/421 |
| 2012/0126904 A1 | 5/2012 | Lee et al. |
| 2012/0294078 A1* | 11/2012 | Kent ................. G11C 11/16 365/171 |
| 2013/0037862 A1 | 2/2013 | Kitagawa et al. |
| 2014/0008742 A1* | 1/2014 | Chen ................ G01R 33/098 257/421 |
| 2014/0111195 A1 | 4/2014 | Kuo et al. |
| 2015/0185297 A1 | 7/2015 | Zimmer |

OTHER PUBLICATIONS

Final Office Action dated Dec. 17, 2014 for U.S. Appl. No. 13/850,345.

Non-Final Office Action dated Mar. 23, 2015 for U.S. Appl. No. 13/850,345.

Notice of Allowance dated Sep. 14, 2015 for U.S. Appl. No. 13/850,345.

* cited by examiner

MAGNETORESISTIVE DEVICES AND METHODS FOR MANUFACTURING MAGNETORESISTIVE DEVICES

REFERENCE TO RELATED APPLICATION

This application is a Divisional of U.S. application Ser. No. 13/850,345 filed on Mar. 26, 2013, the contents of which are incorporated by reference in their entirety.

FIELD

This disclosure relates to magnetoresistive devices. The disclosure further relates to methods for manufacturing magnetoresistive devices.

BACKGROUND

Magnetoresistive devices may be based on tunnel magnetoresistive (TMR), giant magnetoresistive (GMR), anisotropic magnetoresistive (AMR) and other technologies that may collectively be referred to as xMR technologies. Some magnetoresistive devices may require an additional top metal layer that may result in additional manufacturing steps. Magnetoresistive devices and methods for manufacturing magnetoresistive devices constantly have to be improved. In particular, it may be desirable to reduce the complexity of the magnetoresistive devices and further to reduce the costs for manufacturing the magnetoresistive devices.

BRIEF DESCRIPTION OF THE DRAWINGS

The accompanying drawings are included to provide a further understanding of aspects and are incorporated in and constitute a part of this specification. The drawings illustrate aspects and together with the description serve to explain principles of aspects. Other aspects and many of the intended advantages of aspects will be readily appreciated as they become better understood by reference to the following detailed description. The elements of the drawings are not necessarily to scale relative to each other. Like reference numerals may designate corresponding similar parts.

DETAILED DESCRIPTION

In the following detailed description, reference is made to the accompanying drawings, which form a part hereof, and in which is shown by way of illustration specific aspects in which the disclosure may be practiced. In this regard, directional terminology, such as "top," "bottom," "front," "back," etc., may be used with reference to the orientation of the figures being described. Since components of described devices may be positioned in a number of different orientations, the directional terminology may be used for purposes of illustration and is in no way limiting. It is understood that other aspects may be utilized and structural or logical changes may be made without departing from the scope of the present disclosure. Hence, the following detailed description is not to be taken in a limiting sense, and the scope of the present disclosure is defined by the appended claims.

It is understood that the features of the various exemplary aspects described herein may be combined with each other, unless specifically noted otherwise.

As employed in this specification, the terms "coupled" and/or "electrically coupled" are not meant to mean that the elements must be directly coupled together. Intervening elements may be provided between the "coupled" or "electrically coupled" elements. To the extent that the term "exemplary" is used herein, such term is intended to mean an example rather than preferred.

Figure 1:
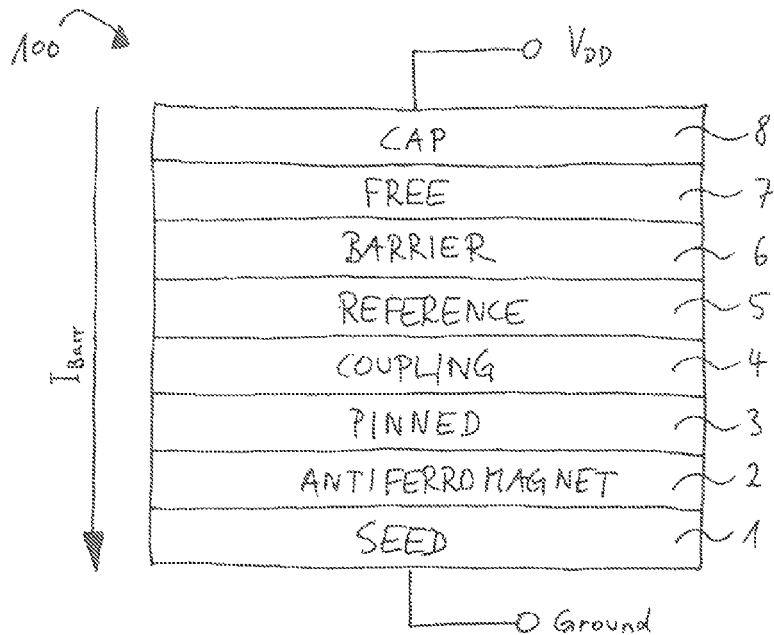
FIG. 1 schematically illustrates a cross-sectional view of a TMR stack 100.

FIG. 1 schematically illustrates a cross-sectional view of a TMR stack 100. The TMR stack 100 may include the following layers that may be arranged in the exemplary order of FIG. 1: a seed layer 1, a (natural or synthetic) antiferromagnetic layer 2, a pinned layer 3, a coupling layer 4, a reference layer 5, a tunnel barrier layer 6, a free layer 7, and a cap layer 8.

The seed layer 1 may include at least one of Ta, TaN, NiCr, and any other suitable material. The seed layer 1 may be electrically connected to a bottom contact (see "Ground") that may provide a first electrical potential, in particular ground in one example. The antiferromagnetic layer 2 may include at least one of PtMn, IrMn, and any other suitable material while the pinned layer 3 may contain a ferromagnetic material, for example CoFe or any other suitable material. The coupling layer 4 may be arranged over the pinned layer 3 and may e.g. include Ru or any other suitable material. The reference layer 5 may include a ferromagnetic material, for example CoFeB or any other suitable material. Further, the free layer 7 may contain at least one of e.g. NiFe, CoFe, CoFeB, or any other suitable material. The tunnel barrier layer 6 arranged between the reference layer 5 and the free layer 7 may e.g. include MgO. The cap layer 9 may include Ta, TaN, or any other suitable material and may be electrically connected to a top contact (see "$V_{DD}$"). The top contact may provide a second electrical potential such that a non-zero voltage $V_{DD}$ may be applied between the bottom contact and the top contact in one example.

A magnetization of the antiferromagnetic layer 2 may be fixed while a magnetization of the free layer 7 may be configured to rotate freely in response to an external magnetic field. In embodiments, free layers may be the only layers which change direction of magnetization with the external magnetic field. In embodiments, the angle of the in-plane magnetization of the free layer and the reference layer may determine the sensor's output signal. A magnetization of the pinned layer 3 may be pinned by exchange coupling with the antiferromagnetic layer 2. The pinned layer 3 and the reference layer 5 may be magnetically coupled by the coupling layer 4. The seed layer 1 and the cap layer 8 may be configured to provide an electrical coupling to the bottom contact and the top contact, respectively.

During operation, the TMR stack 100 may require a current flow perpendicular to the stack layers in order to force a current through the tunnel barrier layer 6. Such current flow may be established by applying suitable electrical potentials to the bottom contact and the top contact. In FIG. 1, a possible electrical current $I_{Barr}$ is indicated by an arrow in a downward direction from the top contact to the bottom contact.

Figure 2:
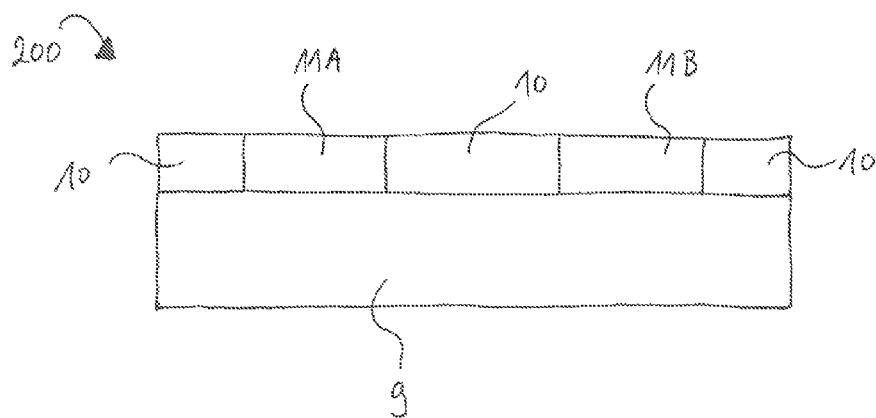
FIG. 2 schematically illustrates a cross-sectional view of a magnetoresistive device 200 in accordance with the disclosure.
Figure 3A:
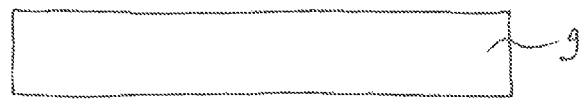
FIGS. 3A to 3F schematically illustrate a cross-sectional view of a method for manufacturing a magnetoresistive device 300 in accordance with the disclosure.
Figure 3B:
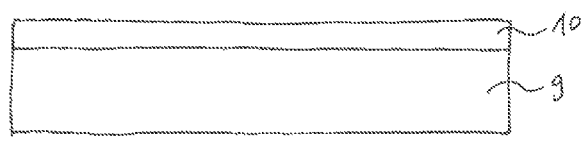
Figure 3C:
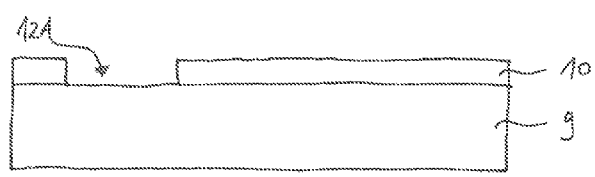
Figure 3D:
Figure 3E:
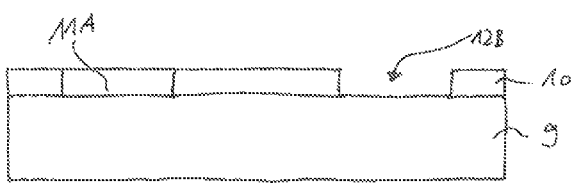
Figure 3F:
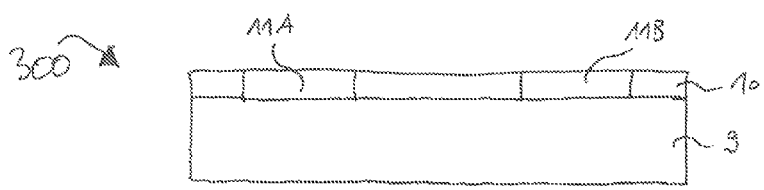

FIG. 2 schematically illustrates a cross-sectional view of a magnetoresistive device 200 in accordance with the disclosure. The magnetoresistive device 200 may include a substrate 9 and an electrically insulating layer 10 arranged over the substrate 9. The magnetoresistive device 200 may further include a first free layer 11A embedded in the electrically insulating layer 10 and a second free layer 11B embedded in the electrically insulating layer 10. The first free layer 11A and the second free layer 11B may be separated by the electrically insulating layer 10. It is noted that more detailed magnetoresistive devices similar to the magnetoresistive device 200 as well as methods for manufacturing such magnetoresistive devices are described below.

FIGS. 3A to 3F schematically illustrate a cross-sectional view of a method for manufacturing a magnetoresistive device 300 in accordance with the disclosure. In a first act (see FIG. 3A), a substrate 9 may be provided. In a second act (see FIG. 3B), an electrically insulating layer 10 may be deposited over the substrate 9. In a third act (see FIG. 3C), a first groove 12A may be formed in the electrically insulating layer 10. In a fourth act (see FIG. 3D), a second groove 12B may be formed in the electrically insulating layer 10, wherein the first groove 12A may be separated from the second groove 12B. In a fifth act (see FIG. 3E), a first free layer 11A may be deposited in the first groove 12A. In a sixth act (see FIG. 3F), a second free layer 11B may be deposited in the second groove 12B. The obtained magnetoresistive device 300 may be similar to the magnetoresistive device 200 of FIG. 2. It is noted that a more detailed method similar to the specified method is described in connection with FIGS. 4A to 4G.

FIGS. 4A to 4G schematically illustrate a cross-sectional view of a method for manufacturing a magnetoresistive device 400 in accordance with the disclosure. For example, at least one of the specified method acts may be integrated in a Complementary Metal Oxide Semiconductor (CMOS) manufacturing process. The manufactured magnetoresistive device 400 may be seen as an implementation of the magnetoresistive devices 200 and 300 such that details of the magnetoresistive device 400 described below may be likewise applied to the magnetoresistive devices 200 and 300. In one example, the magnetoresistive device 400 may be configured to operate as a TMR device. However, the described method may also be employed for manufacturing magnetoresistive devices that may be based on other xMR effects. The method illustrated in FIGS. 4A to 4G may be seen as an implementation of the method illustrated in FIGS. 3A to 3F. Details of the manufacturing method that are described below may therefore be likewise applied to the method of FIGS. 3A to 3F.

Figure 4A:
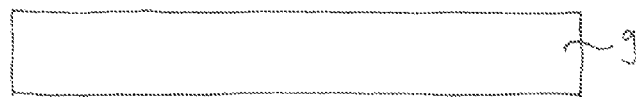
FIGS. 4A to 4G schematically illustrate a cross-sectional view of a method for manufacturing a magnetoresistive device 400 in accordance with the disclosure.

In FIG. 4A, a substrate 9 may be provided. The substrate 9 may be made of or may include an electrically insulating material, for example at least one of silicon oxide ($SiO_2$), silicon nitride ($Si_3N_4$), and any other suitable material.

Figure 4B:
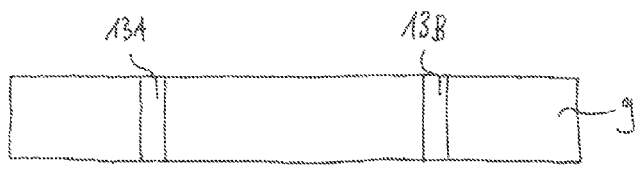

In FIG. 4B, through holes may be formed in the substrate 9 by applying a suitable technique, for example etching, laser drilling, etc. The through holes may extend from an upper main surface of the substrate 9 to a lower main surface of the substrate 9. Each of the through holes may be filled with an electrically conductive material such that a first electrical contact 13A and a second electrical contact 13B may be formed. Each of the electrical contacts 13A, 13B may be configured to provide an electrical connection between the upper main surface of the substrate 9 and the lower surface of the substrate 9 at the position of the respective through hole. In particular, the electrical contacts 13A, 13B may extend at least partially through the substrate 9 and may be configured to provide an electrical connection between free layers that are to be formed in a later process step and a wiring structure (not illustrated) that may e.g. be arranged underneath the substrate 9. Any suitable electrically conductive material may be used for manufacturing the electrical contacts 13A, 13B, for example a metal (e.g. Cu, W, Al) and/or a metal alloy.

Figure 4C:
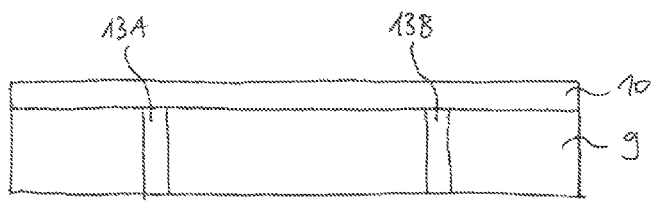

In FIG. 4C, an electrically insulating layer or dielectric layer 10 may be deposited over the substrate 9. The dielectric layer 10 may include at least one of a nitride (e.g. silicon nitride), an oxide (e.g. silicon oxide), and any other suitable material. Any suitable technique may be used to form the dielectric layer 10, for example a plasma deposition process, laminating, printing, dispensing, spin-coating, etc. In particular, the dielectric layer 10 may completely cover the upper surface of the substrate 9 and may be structured later thereon. A thickness of the dielectric layer 10 may lie in a range from about 0.5 nanometers to about 50 nanometers, more particularly in a range from about 2 nanometers to about 20 nanometers. The thickness of the dielectric layer 10 may substantially equal a desired thickness of one or more free layers that are to be formed later on.

Figure 4D:
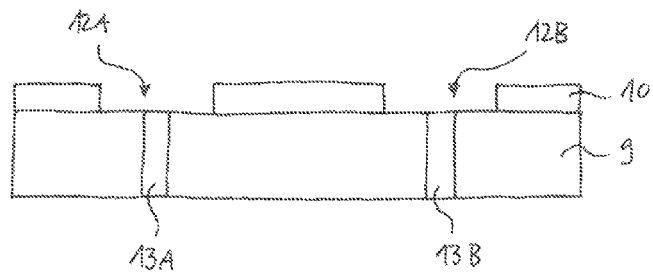

In FIG. 4D, a first groove 12A and a second groove 12B may be formed in the dielectric layer 10. Here, the dielectric layer 10 may be opened at the positions of the electrical contacts 13A, 13B such that the electrical contacts 13A, 13B may be exposed. For example, each groove 12A, 12B may have a maximum width lying in a range from about 100 nanometers to about 300 nanometers. A shape or footprint of the grooves 12A, 12B may be chosen to optimize a magnetic property of the free layers that are to be arranged in the grooves 12A, 12B later on. For the case of an angle sensing magnetoresistive device to be manufactured, the grooves 12A, 12B may e.g. have a circular shape. Any suitable technique may be employed for forming the grooves 12A, 12B, for example techniques that may be based on photolithography, etching (e.g. wet etching, plasma etching), etc.

Figure 4E:
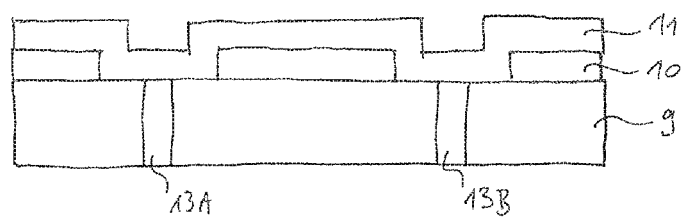

In FIG. 4E, a free layer system 11 may be deposited in the first groove 12A, in the second groove 12B and over the dielectric layer 10. The free layer system 11 may include a free layer that may e.g. include NiFe, CoFe, CoFeB, or any other suitable material. In addition, the free layer system 11 may include a seed layer and optional additional functional layers. A thickness of the free layer system 11 may particularly depend on a thickness of the dielectric layer 10 and thus the depths of the grooves 12A, 12B. In particular, a thickness of the free layer system 11 may be chosen such that the grooves 12A, 12B may be completely filled with the free layer system 11. Any suitable technique may be used for forming the free layer system 11, for example laminating, plating, CVD (Chemical Vapor Deposition), PVD (physical vapor deposition), etc.

Figure 4F:
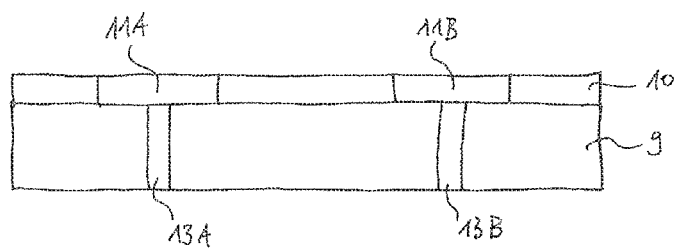

In FIG. 4F, parts of the free layer system 11 arranged over the dielectric layer 10 may be removed such that only the grooves 12A, 12B may remain filled with the free layer system 11 material. This way, a first free layer 11A and a second free layer 11B may be formed in the first groove 12A and the second groove 12B, respectively. A thickness of the first free layer 11A and the second free layer 11B may depend on a thickness of the dielectric layer 10 deposited earlier and may lie in a range from about 0.5 nanometers to about 50 nanometers, more particularly in a range from about 2 nanometers to about 20 nanometers, respectively. The first free layer 11A may electrically contact the first electrical contact 13A while the second free layer 11B may electrically contact the second electrical contact 13B. In this connection, it is to be noted that the arrangement of the electrical contacts 13A, 13B in FIG. 4F is of exemplary character. In another example, at least one of the electrical contacts 13A, 13B may be replaced by an electrical contact that may provide an electrical connection between the respective free layer and a side surface of the substrate 9.

Any suitable technique may be used to remove the parts of the free layer system 11, in particular a CMP (Chemical Mechanical Polishing) process. In the latter case, a thickness of the dielectric layer 10 may determine the thickness of the first free layer 11A and the second free layer 11B, since the CMP process may particularly stop on the dielectric layer 10. After removing the parts of the free layer system 11, the surface of the first free layer 11A facing away from the substrate 9 and the surface of the second free layer 11B facing away from the substrate 9 may be flush with the surface of the dielectric layer 10 facing away from the substrate 9.

Since both of the first free layer 11A and the second free layer 11B may be formed from the free layer system 11, the first free layer 11A and the second free layer 11B may be made of a same material. In another example, the material of the first free layer 11A may differ from the material of the second free layer 11B. In this case, the method steps described in connection with FIGS. 4E and 4F may be performed twice, wherein different materials may be used for forming the free layers 11A and 11B.

Figure 4G:
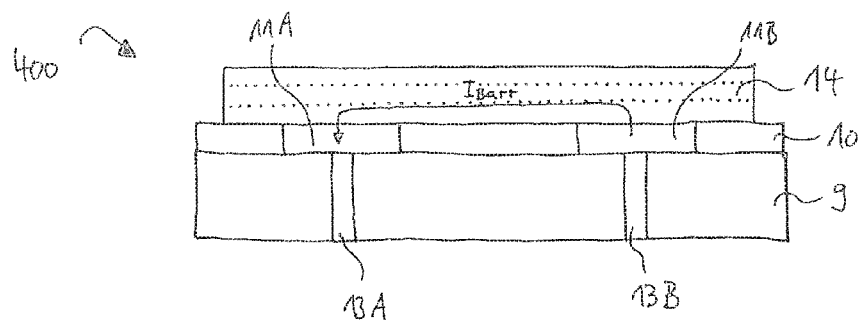

In FIG. 4G, a layer stack 14 may be formed over the first free layer 11A, the second free layer 11B and the dielectric layer 10. The layer stack 14 may include one or more layers that have been specified in connection with FIG. 1. Comments made in connection with FIG. 1 thus may also hold true for FIG. 4G. For example, a tunnel barrier layer may be arranged over the free layers 11A, 11B and the dielectric layer 10. Furthermore, a reference system may be arranged over the tunnel barrier layer, wherein the reference system may include at least one of the following layers in the specified order: a reference layer, a coupling layer, a pinned layer, an antiferromagnetic layer, and a cap layer. The layer stack 14 may be structured by an etching process, such as chemical etching, plasma etching, sputter etching, etc. In one example, the layer stack 14 may have a thickness from about 5 nanometers to about 100 nanometers.

During an operation of the obtained magnetoresistive device 400, electrical potentials may be applied to the electrical contacts 13A, 13B such that a current $I_{Barr}$ may flow along a current path between the first free layer 11A and the second free layer 11B. In FIG. 4G, an exemplary current path is indicated by an arrow. That is, an electrical connection between a layer stack portion over the first free layer 11A and the second free layer 11B may be established. Here, the whole current $I_{Barr}$ may be forced through the tunnel barrier layer which may result in a maximum available CPP (Current Perpendicular to Plane) TMR effect height. A resistance of a so formed TMR element may be designed by selecting a desired combination of tunnel barrier layer resistance and tunnel barrier layer area. For the case of a TMR element, the layer stack 14 may also be referred to as TMR reference layer stack.

It is noted that the magnetoresistive device 400 may e.g. be seen as a magnetoresistive structure including two magnetically independent TMR elements that are connected in series, wherein each of the serially connected TMR elements may include a structure similar to the TMR stack 100 of FIG. 1. The first TMR element may include the first free layer 11A while the second TMR element may include the second free layer 11B. Each of the first TMR element and the second TMR element may be configured to operate in a CPP mode. It is noted that the magnetoresistive device 400 does not require an electrical contact from above. Rather, the presented method is suitable to manufacture a TMR element that may provide an electrical CIP (Current In Plane) configuration having contacts only from one side, but working in a CPP configuration. It is further to be noted that the resulting structure of the magnetoresistive device 400 may be accessible for optical methods, for example a laser for thermal treatment.

It is understood that further magnetoresistive devices having a similar functionality as the magnetoresistive device 400 may be manufactured by performing a similar method. In one example, a similar functionality may be achieved by forming a first layer stack including a reference system in the first groove 11A, forming a second layer stack including a reference system in the second groove 11B, and forming a barrier layer and a free layer above the formed first layer stack and the formed second layer stack.

It is further understood that the magnetoresistive device 400 may include one or more further components (not illustrated). For example, the magnetoresistive device 400 may further include a wiring structure that may e.g. be arranged underneath the lower main surface of the substrate 9. Such wiring structure may be configured to provide an electrical connection between the electrical contacts 13A, 13B and an external application that may use the magnetoresistive device 400 during an operation.

Figure 5:
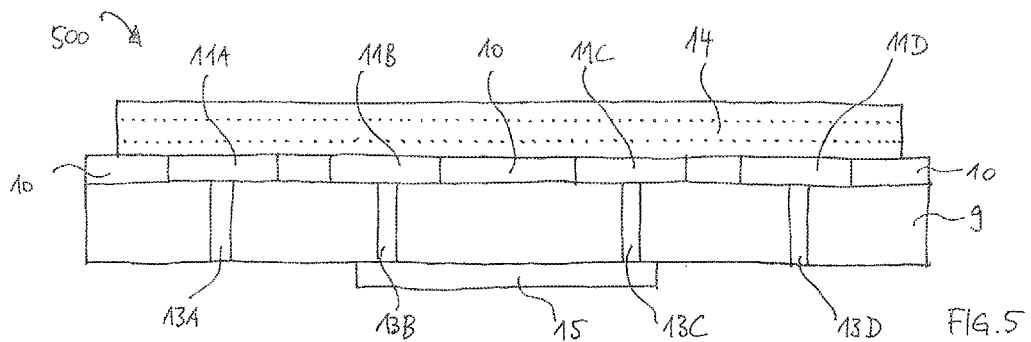
FIG. 5 schematically illustrates a cross-sectional view of a magnetoresistive device 500 in accordance with the disclosure.
Figure 6:
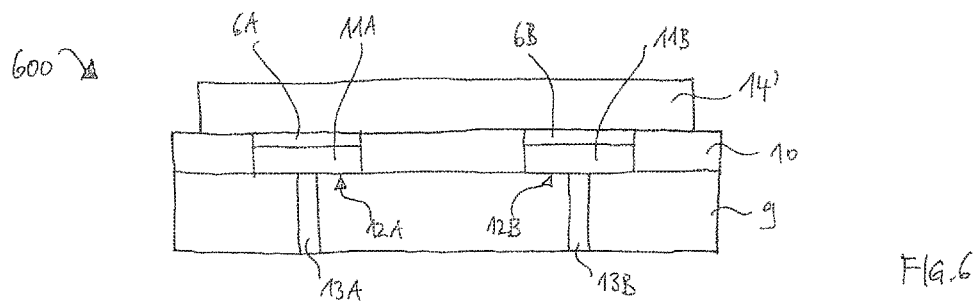
FIG. 6 schematically illustrates a cross-sectional view of a magnetoresistive device 600 in accordance with the disclosure.
Figure 7:
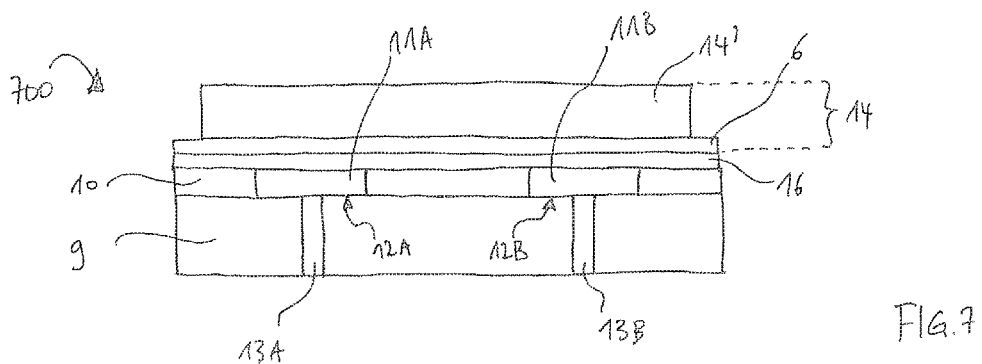
FIG. 7 schematically illustrates a cross-sectional view of a magnetoresistive device 700 in accordance with the disclosure.

FIGS. 5 to 7 schematically illustrate cross-sectional views of magnetoresistive devices 500 to 700 in accordance with the disclosure. Each of the magnetoresistive devices 500 to 700 may be similar to the magnetoresistive device 400 such that comments made in connection with FIGS. 4A to 4G may also hold true for each of FIGS. 5 to 7. In particular, the magnetoresistive devices 500 to 700 of FIGS. 5 to 7 may be manufactured based on a method that may at least partly be similar to the method described in connection with FIGS. 4A to 4G.

The magnetoresistive device 500 of FIG. 5 may include a substrate 9 and electrical contacts 13A to 13D, each of which may extend from an upper main surface of the substrate 9 to a lower main surface of the substrate 9. A dielectric layer 10 may be arranged over the substrate 9 wherein a first free layer 11A, a second free layer 11B, a third free layer 11C and a fourth free layer 11D may be embedded in the dielectric layer 10. The surfaces of the free layers 11A to 11D facing away from the substrate 9 may be flush with the surface of the dielectric layer 10 facing away from the substrate 9. An electrical connection 15 may be arranged on the lower main surface of the substrate 9. The electrical connection 15 may provide an electrical coupling between the second free layer 11B and the third free layer 11C. For example, the electrical connection 15 may be a part of a wiring structure arranged underneath the lower main surface of the substrate 9.

The magnetoresistive device 500 may be configured to operate as a TMR device. In particular, the magnetoresistive device 500 may be seen as a first TMR element and a second TMR element connected in series via the electrical connection 15, wherein each of the first and second TMR element may be similar to the magnetoresistive device 400 of FIG. 4G. In particular, the first TMR element may be identified to include the first free layer 11A and the second free layer 11B while the second TMR element may be identified to include the third free layer 11C and the fourth free layer 11D. It is noted that similar magnetoresistive devices may be designed that may include an even number (i.e. two, four, six, etc.) of TMR devices connected in series, wherein each of the serially connected devices may be similar to the magnetoresistive device 400 of FIG. 4G.

During an operation of the magnetoresistive device 500, electrical potentials may be applied to the electrical contacts 13A and 13D such that a current may flow along a current path through the magnetoresistive device 500. In particular, a current may flow from the first free layer 11A to the second free layer 11B via the layer stack 14, from the second free layer 11B to the third free layer 11C via the electrical connection 15, and from the third free layer 11C to the fourth free layer 11D via the layer stack 14.

The magnetoresistive device 600 of FIG. 6 may be configured to operate as a TMR device. Referring back to FIG. 4G, the magnetoresistive device 400 may include a tunnel barrier layer included in the layer stack 14. In contrast to FIG. 4G, the magnetoresistive device 600 of FIG. 6 may include a first tunnel barrier layer 6A arranged over a first free layer 11A in a first groove 12A and a second tunnel barrier layer 6B arranged over a second free layer 11B in a second groove 12B. Hence, in contrast to the layer stack 14 of FIG. 4G, a layer stack 14' of the magnetoresistive device 600 does not necessarily include a tunnel barrier layer. Each of the tunnel barrier layers 6A and 6B may have been patterned by a CMP process as described in connection with FIG. 4F such that a surface of the first tunnel barrier layer 6A facing away from the substrate 9 and a surface of the second tunnel barrier 6B layer facing away from the substrate 9 may be flush with a surface of the dielectric layer 10 facing away from the substrate 9.

The magnetoresistive device 700 of FIG. 7 may be configured to operate as a TMR device. In contrast to the magnetoresistive device 400 of FIG. 4G, the magnetoresistive device 700 may include an additional ferromagnetic interface layer 16 that may be arranged between the first free layer 11A and the layer stack 14 as well as between the second free layer 11B and the layer stack 14. In particular, the ferromagnetic interface layer 16 may be arranged between the first free layer 11A and a tunnel barrier layer 6 included in the layer stack 14 as well as between the second free layer 11B and the tunnel barrier layer 6. The ferromagnetic interface layer 16 may e.g. include at least one of CoFe, CoFeB, and any other suitable material. A thickness of the ferromagnetic interface layer 16 may be chosen such that a magnetic response to an external field may be defined by a material of the free layers 11A, 11B arranged in the grooves 12A, 12B. Hence, the thickness of the ferromagnetic interface layer 16 may be smaller than the thickness of the free layers 11A, 11B. It is noted that the ferromagnetic interface layer 16 may be desirable for the functionality of a magnetic tunnel junction, since it allows a formation of clean interfaces of the tunnel barrier. A small shunt current that may flow within the ferromagnetic interface layer 16 may result in a slight degradation of a TMR signal compared to a pure CPP signal.

Figure 8A:
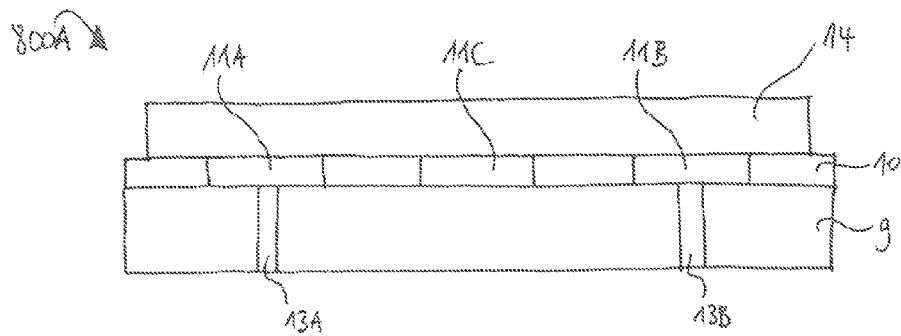
FIG. 8A schematically illustrates a cross-sectional view of a magnetoresistive device 800A in accordance with the disclosure.

FIG. 8A schematically illustrates a cross-sectional view of a magnetoresistive device 800A in accordance with the disclosure. For example, the magnetoresistive device 800A may be configured to operate as a GMR device. The magnetoresistive device 800A may particularly be manufactured based on at least one of the method steps specified in connection with FIGS. 4A to 4G. Corresponding comments thus may also hold true for FIG. 8A. The device 800A shown in FIG. 8A provides the benefit of having one or more free layer elements of any size and shape.

The magnetoresistive device 800A may include a substrate 9 and electrical contacts 13A, 13B, each of which may extend from an upper main surface of the substrate 9 to a lower main surface of the substrate 9. A dielectric layer 10 may be arranged over the substrate 9, wherein a first free layer 11A, a second free layer 11B and a third free layer 11C may be embedded in the dielectric layer 10. A surface of the first free layer 11A, a surface of the second free layer 11B and a surface of the third free layer 11C, each facing away from the substrate 9, may be flush with a surface of the dielectric layer 10 facing away from the substrate 9. The first free layer 11A may be electrically contacted from the lower main surface of the substrate 9 via the first electrical contact 13A while the second free layer 11B may be electrically contacted via the second electrical contact 13B. The magnetoresistive device 800A may further include a layer stack 14 arranged over each of the three free layers 11A to 11C and the dielectric layer 10. In particular, the layer stack 14 may be configured to provide a GMR effect such that it may also be referred to as GMR reference layer stack.

During an operation of the magnetoresistive device 800A, electrical potentials may be applied to the electrical contacts 13A, 13B such that currents may flow along a current path through the magnetoresistive device 800A. In particular, a current may flow from the first free layer 11A to the second free layer 11B and the third free layer 11C, respectively, via the layer stack 14. In addition, a current may flow from the third free layer 11C to the second free layer 11B via the layer stack 14. Hence, the GMR reference layer stack 14 may provide an electrical connection between the neighboring (magnetically independent) free layer elements 11A to 11C. The arrangement of FIG. 8A may be more desirable compared to an integration scheme, in which a connection between GMR elements may be provided by a metal layer that may contact the GMR layers by means of vias.

Figure 8B:
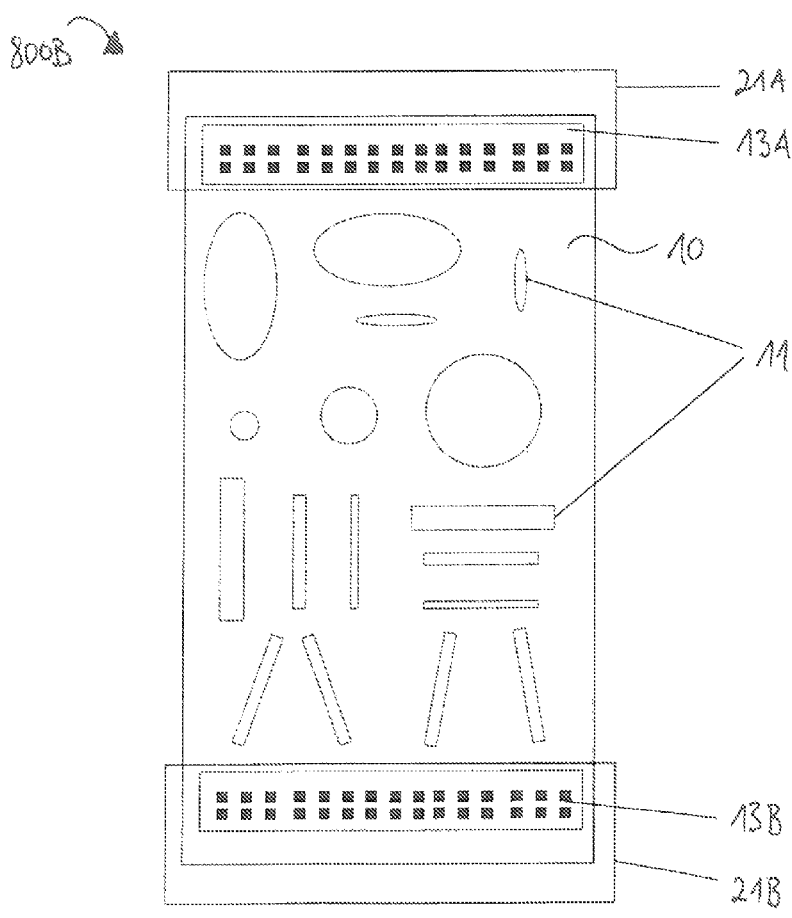
FIG. 8B schematically illustrates a top view of a magnetoresistive device 800B in accordance with the disclosure.

FIG. 8B schematically illustrates a top view of a magnetoresistive device 800B in accordance with the disclosure. The device 800B may be similar to the device 800A of FIG. 8A such that comments made in connection with FIG. 8A may also hold true for FIG. 8B. It is noted that FIG. 8B does not necessarily show all components of the device 800B for illustrative purposes. For example, FIG. 8B does not explicitly illustrate a layer stack similar to the layer stack 14 of FIG. 8A, even though the device 800B may include such a layer stack.

The device 800B may include similar components as the device 800A of FIG. 8A. The device 800B may include a dielectric layer 10 and multiple magnetic active free layer regions 11 that may be embedded in the dielectric layer 10. The multiple free layer elements may be provided with a variety of geometry and sizes as illustrated in FIG. 8B. The free layer regions 11 may be contacted via a first electrical contact region 13A and a second electrical contact region 13B as it has been described in connection with foregoing Figs. The device 800B may further include a first wiring structure 21A and a second wiring structure 21B that may be configured to provide an electrical connection to other circuit elements and external applications that may use the magnetoresistive device 800B during an operation.

It may be an advantage of embodiments such as the arrangements according to FIGS. 8A and 8B that an enhanced degree of freedom with respect to size and shape of the free layer elements may be obtained due to the avoidance of separate contact regions. It may be a further advantage of embodiments that an enhanced contact reliability may be achieved, since the layer stack on the free layer may act as an electrical connection for the free layer elements compared to separate other connection schemes. In embodiments, a multiplicity of free layer elements can be provided with a variety of geometry and sizes as shown in FIG. 8B. The multiplicity of elements are arranged between two contact regions which are formed by free layer elements acting only for electric contacting to the wiring. The new concept allows any possible orientation as for example ellipses with different orientations or circles or stripe-shaped structures. The lateral dimensions of the free layer structures may vary in one embodiment in a range between 50 nm and 50 μm (micrometers). In a further embodiment, the range may vary between 100 nm and 10 μm (micrometers). With the above ranges, flat surfaces can be provided and the forming of inhomogeneous thicknesses can be avoided while the intended magnetic properties may be still influenced in the above ranges. Elements of sizes greater than the above ranges are prone to be thinned too much in the center by a chemical mechanical polishing processing.

Figure 9:
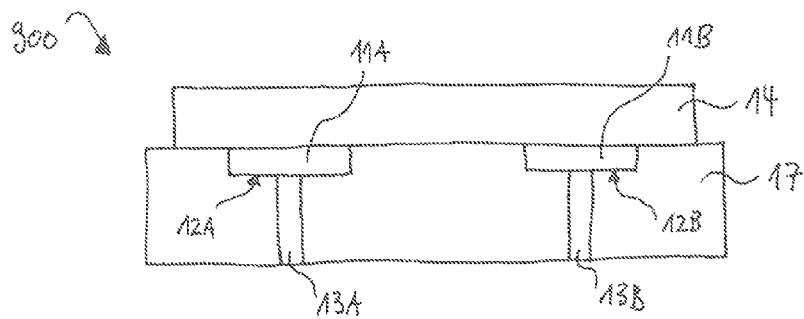
FIG. 9 schematically illustrates a cross-sectional view of a magnetoresistive structure 900 in accordance with the disclosure.

FIG. 9 schematically illustrates a cross-sectional view of a magnetoresistive structure 900 in accordance with the disclosure. The magnetoresistive structure 900 may be similar to previously specified devices in accordance with the disclosure such that previous comments made may also hold true for FIG. 9. In addition, at least one of the method steps described in connection with FIGS. 4A to 4G may be used for manufacturing the magnetoresistive structure 900.

The magnetoresistive structure 900 may include a first free layer 11A in a first opening 12A of an electrically insulating layer 17 and a second free layer 11B in a second opening 12B of the electrically insulating layer 17. The first free layer 11A and the second free layer 11B may be separated by electrically insulating material of the electrically insulating layer 17. At least one layer of a magnetoresistive layer stack 14 may continuously extend above the electrically insulating layer 17 at least from the first opening 12A to the second opening 12B. The magnetoresistive structure 900 may further include a first electric contact 13A to contact the first free layer 11A and a second electric contact 13B to contact the second free layer 11B.

In one example, the magnetoresistive structure 900 may be a TMR structure, wherein at least a tunneling layer of a TMR stack continuously extends above the electrically insulating layer 17 at least from the first opening 12A to the second opening 12B.

In one example, a reference layer may extend above the electrically insulating layer 17 at least from the first opening 12A to the second opening 12B.

In one example, the magnetoresistive structure 900 may be electrically connected to an electric supply such that a current may be supplied to the magnetoresistive structure 900 by the first electric contact 13A and the current may be drained from the magnetoresistive structure 900 by the second electric contact 13B.

In one example, at least one of the first free layer 11A and the second free layer 11B may have no lateral etched surfaces.

Figure 10:
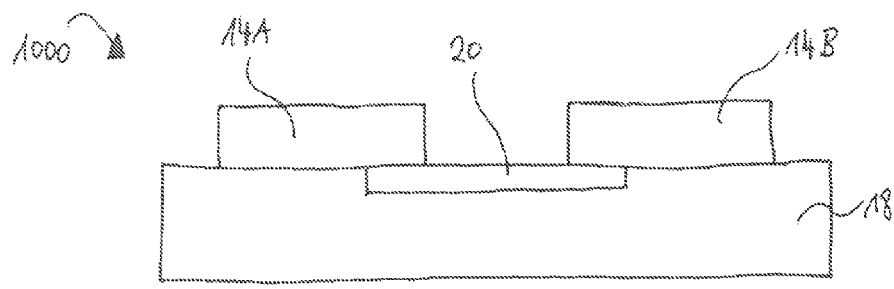
FIG. 10 schematically illustrates a cross-sectional view of a magnetoresistive device 1000 in accordance with the disclosure.

FIG. 10 schematically illustrates a cross-sectional view of a magnetoresistive device 1000 in accordance with the disclosure. The magnetoresistive device 1000 may include an electrically insulating layer 18, a first magnetoresistive layer stack 14A arranged over the electrically insulating layer 18 and a second magnetoresistive layer stack 14B arranged over the electrically insulating layer 18. The magnetoresistive device 1000 may further include an electrically conductive layer 20 embedded in the electrically insulating layer 18 and electrically coupling the first magnetoresistive layer stack 14A and the second magnetoresistive layer stack 14B. It is noted that a more detailed device similar to the magnetoresistive device 1000 is described in connection with FIGS. 11A to 11F.

FIGS. 11A to 11F schematically illustrate a cross-sectional view of a method for manufacturing a magnetoresistive device 1100 in accordance with the disclosure. The manufactured magnetoresistive device 1100 may be seen as an implementation of the magnetoresistive device 1000 such that details of the magnetoresistive device 1100 described below may be likewise applied to the magnetoresistive device 1000.

Figure 11A:
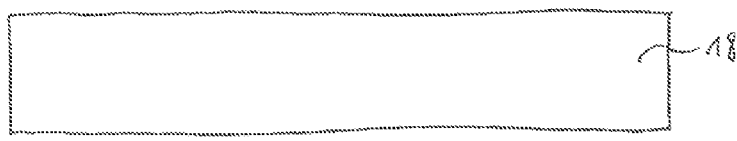
FIGS. 11A to 11F schematically illustrate a cross-sectional view of a method for manufacturing a magnetoresistive device 1100 in accordance with the disclosure.

In FIG. 11A, an electrically insulating layer 18 may be provided. For example, the electrically insulating layer 18 may be made of or may include at least one of silicon oxide (SiO2), silicon nitride (Si3N4), and any other suitable material.

Figure 11B:
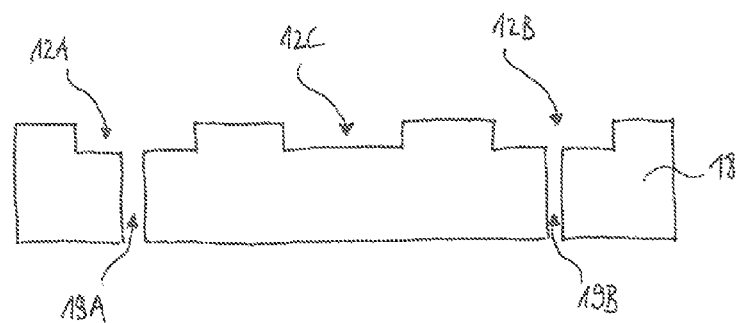

In FIG. 11B, the electrically insulating layer 18 may be structured such that a first groove 12A, a second groove 12B and a third groove 12C may be formed. In addition, a first through hole 19A extending from the bottom of the first groove 12A to the lower main surface of the electrically insulating layer 18 and a second through hole 19B extending from the bottom of the second groove 12B to the lower main surface of the electrically insulating layer 18 may be provided. Any suitable technique may be employed for structuring the electrically insulating layer 18 in the specified manner. In particular, comments made in connection with FIGS. 4B and 4D may also hold true for FIG. 11B.

Figure 11C:
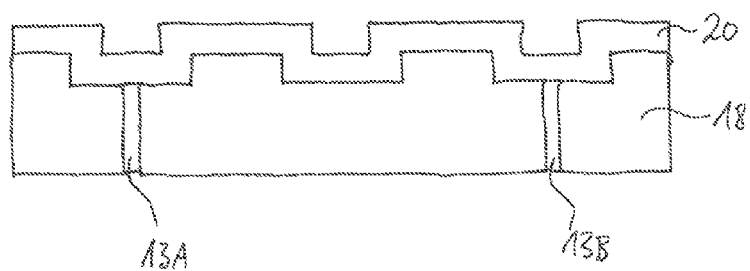

In FIG. 11C, each of the through holes 19A and 19B may be filled with an electrically conductive material such that electrical contacts 13A and 13B may be formed. In this regard, comments made in connection with FIG. 4B may also hold true for FIG. 11C.

In addition, an electrically conductive material 20 may be deposited in the first groove 12A, the second groove 12B and the third groove 12C as well as over the electrically insulating layer 18. Any desired metal, for example at least one of Al, Cu, Ni, Sn, Au, Ag, Pt, Pd, and an alloy of one or more of these metals may be used as the electrically conductive material 20. The electrically conductive material 20 need not be homogenous or manufactured from just one material. Various compositions and concentrations of the materials included in the electrically conductive material 20 may be possible. For example, the electrically conductive material 20 may be in the form of a layer covering an area. In particular, the electrically conductive material 20 may completely cover the upper surface of the electrically insulating layer 18 and may be structured later on.

Figure 11D:
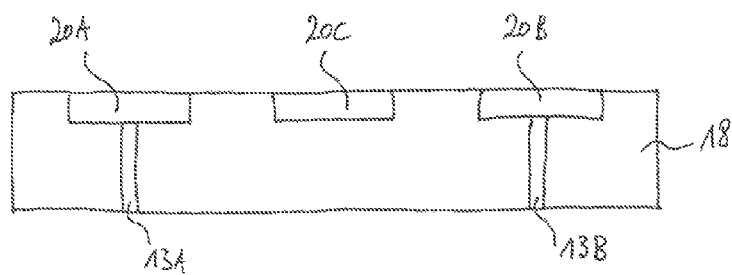

In FIG. 11D, parts of the electrically conductive material 20 arranged over the electrically insulating layer 18 may be removed. Afterwards, each of the grooves 12A to 12C may remain filled with a portion 20A to 20C of the electrically conductive material 20, respectively. It is noted that removing the parts of the electrically conductive material 20 may be similar to removing the parts of the free layer system 11 as described in connection with FIG. 4F. Corresponding comments may thus also hold true for FIG. 11D. After removing the parts of the electrically conductive material 20, the upper surface of the first portion 20A may be flush with the upper surface of the electrically insulating layer 18. Similarly, the upper surfaces of the second portion 20B and the third portion 20C may be flush with the upper surface of the electrically insulating layer 18, respectively.

Figure 11E:
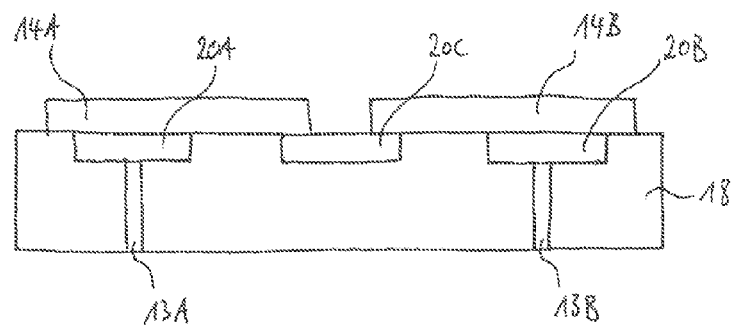

In FIG. 11E, a first layer stack 14A may be formed to continuously extend above the electrically insulating layer 18 from the first portion 20A to the third portion 20C. For example, the first layer stack 14A may include a TMR layer stack as e.g. described in connection with FIG. 4G or a GMR layer as e.g. described in connection with FIG. 8A. In another example, the first layer stack 14A may be configured to act as an AMR layer stack. In a similar fashion, a second layer stack 14B may be formed to continuously extend above the electrically insulating layer 18 from the second portion 20B to the third portion 20C. Comments made in connection with the first layer stack 14A may also hold true for the second layer stack 14B.

The magnetoresistive device 1100 may be configured to operate on the basis of at least one of an AMR effect, a GMR effect, and a TMR effect. The third portion 20C of electrically conductive material may be configured to electrically connect the first layer stack 14A and the second layer stack 14B. Hence, additional electrical connections (e.g. vias) extending through the electrically insulating layer 18 may be omitted. In addition, at least one of the portions 20A to 20C may be used as a so-called barber pole structure. Barber poles are highly conductive regions parallel connected to an AMR film to obtain a defined current direction regarding the magnetic easy axis. This technique is commonly used in the AMR technology.

Figure 11F:
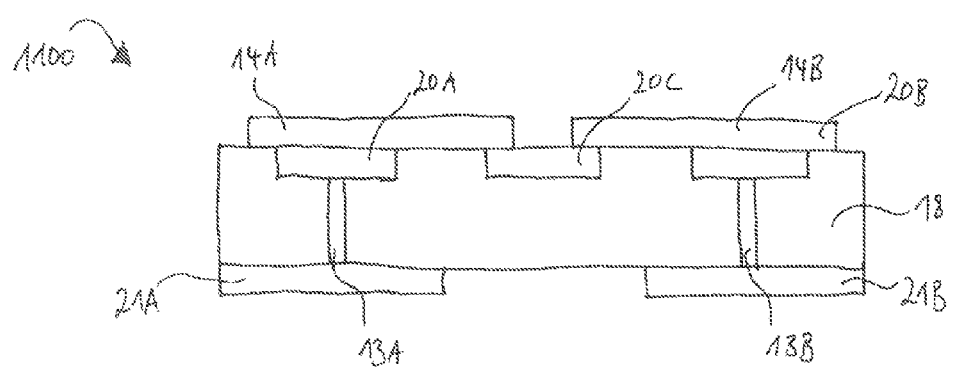

In FIG. 11F, wiring structures 21A and 21B may be formed e.g. underneath the lower surface of the electrically insulating layer 18. The wiring structures 21A and 21B may e.g. provide an electrical connection to other circuit elements and external applications that may use the magnetoresistive device 1100 during an operation.

In Example 1 of the present disclosure, a magnetoresistive device comprises a substrate, an electrically insulating layer arranged over the substrate, a first free layer embedded in the electrically insulating layer, and a second free layer embedded in the electrically insulating layer, wherein the first free layer and the second free layer are separated by a portion of the electrically insulating layer.

In Example 2 of the present disclosure, in Example 1 a surface of the first free layer facing away from the substrate and a surface of the second free layer facing away from the substrate are flush with a surface of the electrically insulating layer facing away from the substrate.

In Example 3 of the present disclosure, the magnetoresistive device in Example 1 further comprises a layer stack arranged over the first free layer and the second free layer.

In Example 4 of the present disclosure, in Example 3 the layer stack comprises a tunnel barrier layer and a reference layer, wherein an electrical connection between a layer stack portion over the first free layer and a layer stack portion over the second free layer is established.

In Example 5 of the present disclosure, the magnetoresistive device of Example 3 further comprises a ferromagnetic interface layer arranged between the first free layer and the layer stack, and between the second free layer and the layer stack.

In Example 6 of the present disclosure, the magnetoresistive device of Example 1 further comprises a first tunnel barrier layer arranged over the first free layer, and a second tunnel barrier layer arranged over the second free layer, wherein the first tunnel barrier layer and the second tunnel barrier layer are separated by a portion of the electrically insulating layer, and wherein a surface of the first tunnel barrier layer facing away from the substrate and a surface of the second tunnel barrier layer facing away from the substrate are flush with a surface of the electrically insulating layer facing away from the substrate.

In Example 7 of the present disclosure, the magnetoresistive device of Example 1 further comprises an electrical contact element extending at least partially through the substrate and electrically coupled to the first free layer.

In Example 8 of the present disclosure, the magnetoresistive device of Example 1 further comprises a third free layer embedded in the electrically insulating layer between the first free layer and the second free layer, wherein the third free layer is separated from the first free layer and the second free layer by portions of the electrically insulating layer.

In Example 9 of the present disclosure, in Example 1 each of the first free layer, the second free layer, and the electrically insulating layer has a thickness in a range from 0.5 nanometers to 50 nanometers.

In Example 10 of the present disclosure, in Example 1 the first free layer and the second free layer are manufactured from a same material.

In Example 11 of the present disclosure, in Example 1 the magnetoresistive device comprises a first tunnel magnetoresistive element and a second tunnel magnetoresistive element connected in series, wherein the first tunnel magnetoresistive element comprises the first free layer and the second tunnel magnetoresistive element comprises the second free layer.

In Example 12 of the present disclosure, in Example 1 the magnetoresistive device comprises a first tunnel magnetoresistive element and a second tunnel magnetoresistive element connected in series, wherein each of the first tunnel magnetoresistive element and the second tunnel magnetoresistive element is configured to operate in a current-perpendicular-to-plane mode.

In Example 13 of the present disclosure, in Example 1 the magnetoresistive device comprises a current path between the first free layer and the second free layer.

In Example 14 of the present disclosure, in Example 1 the first free layer and the second free layer are free layers of a giant magnetoresistive element or a tunnel magnetoresistive element.

In Example 15 of the present disclosure a method for manufacturing a magnetoresistive device comprises providing a substrate, depositing an electrically insulating layer over the substrate, and forming a first groove in the electrically insulating layer. The method further comprises forming a second groove in the electrically insulating layer, wherein the first groove is separated from the second groove, depositing a first free layer in the first groove, and depositing a second free layer in the second groove.

In Example 16 of the present disclosure, in Example 15 forming the first groove and the second groove comprises etching the electrically insulating layer.

In Example 17 of the present disclosure, in Example 15 depositing the first free layer in the first groove and depositing the second free layer in the second groove comprises depositing a free layer in the first groove, in the second groove and over the electrically insulating layer and removing the free layer over the electrically insulating layer.

In Example 18 of the present disclosure, in Example 17 removing the free layer over the electrically insulating layer comprises performing a chemical mechanical polishing process.

In Example 19 of the present disclosure, in Example 15 providing the substrate comprises providing a substrate with a first contact to contact the first free layer and a second contact to contact the second free layer.

In Example 20 of the present disclosure, in Example 15 the method is integrated in a CMOS manufacturing process.

In Example 21 of the present disclosure a magnetoresistive device comprises an electrically insulating layer, a first magnetoresistive layer stack arranged over the electrically insulating layer, a second magnetoresistive layer stack arranged over the electrically insulating layer, and an electrically conductive layer embedded in the electrically insulating layer and electrically coupling the first magnetoresistive layer stack and the second magnetoresistive layer stack.

In Example 22 of the present disclosure, in Example 21 a surface of the electrically insulating layer is flush with a surface of the electrically conductive layer facing away from the substrate.

In Example 23 of the present disclosure, the magnetoresistive device in Example 21 further comprises a second electrically conductive layer embedded in the electrically insulating layer, wherein the first electrically conductive layer and the second electrically conductive layer are separated by a portion of the electrically insulating layer, and an electrical contact element extending through the electrically insulating layer and electrically coupled to the second electrically conductive layer.

In Example 24 of the present disclosure a magnetoresistive structure comprises a first free layer in a first opening of an electrically insulating layer, a second free layer in a second opening of the electrically insulating layer, the first free layer and the second free layer separated by a portion of electrically insulating material of the electrically insulating layer, wherein at least one layer of a magnetoresistive layer stack continuously extends above the electrically insulating layer at least from the first opening to the second opening, and a first electric contact to contact the first free layer and a second electric contact to contact the second free layer.

In Example 25 of the present disclosure, in Example 24 the magnetoresistive structure is a tunnel magnetoresistive structure, wherein at least a tunneling layer of a tunnel magnetoresistive stack continuously extends above the electrically insulating layer at least from the first opening to the second opening.

In Example 26 of the present disclosure, in Example 25 a reference layer extends above the electrically insulating layer at least from the first opening to the second opening.

In Example 27 of the present disclosure, in Example 24 the magnetoresistive structure is electrically connected to an electric supply such that a current is supplied to the magnetoresistive structure by the first electric contact and the current is drained from the magnetoresistive structure by the second electric contact.

While a particular feature or aspect of the disclosure may have been disclosed with respect to only one of several implementations, such feature or aspect may be combined with one or more other features or aspects of the other implementations as may be desired and advantageous for any given or particular application. Furthermore, to the extent that the terms "include", "have", "with", or other variants thereof are used in either the detailed description or the claims, such terms are intended to be inclusive in a manner similar to the term "comprise". Also, the term "exemplary" is merely meant as an example, rather than the best or optimal. It is also to be appreciated that features and/or elements depicted herein are illustrated with particular dimensions relative to one another for purposes of simplicity and ease of understanding, and that actual dimensions may differ substantially from that illustrated herein.

Although specific examples have been illustrated and described herein, it will be appreciated by those of ordinary skill in the art that a variety of alternate and/or equivalent implementations may be substituted for the specific aspects shown and described without departing from the scope of the present disclosure. This application is intended to cover any adaptations or variations of the specific aspects discussed herein. Therefore, it is intended that this disclosure be limited only by the claims and the equivalents thereof.

What is claimed is:

1. A method for manufacturing a magnetoresistive device, the method comprising:
   providing a substrate;
   depositing an electrically insulating layer over the substrate;
   forming a first groove in the electrically insulating layer;
   forming a second groove in the electrically insulating layer, wherein the first groove is separated from the second groove;
   depositing a first free layer in the first groove, wherein the first free layer completely fills the first groove; and
   depositing a second free layer in the second groove, wherein the second free layer completely fills the second groove.

2. The method of claim 1, wherein forming the first groove and the second groove comprises etching the electrically insulating layer.

3. The method of claim 1, wherein depositing the first free layer in the first groove and depositing the second free layer in the second groove comprises:
   depositing a free layer in the first groove, in the second groove and over the electrically insulating layer; and
   removing the free layer over the electrically insulating layer.

4. The method of claim 3, wherein removing the free layer over the electrically insulating layer comprises performing a chemical mechanical polishing process.

5. The method of claim 1, wherein providing the substrate comprises providing the substrate with a first contact to contact the first free layer and a second contact to contact the second free layer.

6. The method of claim 1, wherein the method is integrated in a CMOS manufacturing process.

7. A magnetoresistive device, comprising:
   an electrically insulating layer;
   a first magnetoresistive layer stack arranged over the electrically insulating layer;

a second magnetoresistive layer stack arranged over the electrically insulating layer;

a first electrically conductive layer embedded in the electrically insulating layer and electrically coupling the first magnetoresistive layer stack and the second magnetoresistive layer stack; and a second electrically conductive layer embedded in the electrically insulating layer, wherein the first electrically conductive layer and the second electrically conductive layer are separated by a portion of the electrically insulating layer, wherein a surface of the electrically insulating layer and a surface of the first electrically conductive layer exposed from the electrically insulating layer and a surface of the second electrically conductive layer exposed from the electrically insulating layer are arranged in a common plane.

8. The magnetoresistive device of claim 7, further comprising:

an electrical contact element extending through the electrically insulating layer and electrically coupled to the second electrically conductive layer.

9. A magnetoresistive structure, comprising:

a first free layer in a first opening of an electrically insulating layer, wherein the first free layer completely fills the first opening;

a second free layer in a second opening of the electrically insulating layer, wherein the second free layer completely fills the second opening, where the first free layer and the second free layer separated by a portion of electrically insulating material of the electrically insulating layer, wherein at least one layer of a magnetoresistive layer stack continuously extends above the electrically insulating layer at least from the first opening to the second opening; and a first electric contact to contact the first free layer and a second electric contact to contact the second free layer.

10. The magnetoresistive structure of claim 9, wherein the magnetoresistive structure is a tunnel magnetoresistive structure, wherein at least a tunneling layer of a tunnel magnetoresistive stack continuously extends above the electrically insulating layer at least from the first opening to the second opening.

11. The magnetoresistive structure of claim 10, wherein a reference layer extends above the electrically insulating layer at least from the first opening to the second opening.

12. The magnetoresistive structure of claim 9, wherein the magnetoresistive structure is electrically connected to an electric supply such that a current is supplied to the magnetoresistive structure by the first electric contact and the current is drained from the magnetoresistive structure by the second electric contact.

* * * * *